United States Patent
Regev et al.

(10) Patent No.: US 7,020,000 B2
(45) Date of Patent: Mar. 28, 2006

(54) REDUCING POWER DISSIPATION IN A MATCH DETECTION CIRCUIT

(75) Inventors: Zvi Regev, West Hills, CA (US); Alon Regev, Woodland Hills, CA (US)

(73) Assignee: Micon Technology, Inc., Boise, ID (US)

( * ) Notice: Subject to any disclaimer, the term of this patent is extended or adjusted under 35 U.S.C. 154(b) by 0 days.

(21) Appl. No.: 11/048,843

(22) Filed: Feb. 3, 2005

(65) Prior Publication Data

US 2005/0135136 A1    Jun. 23, 2005

Related U.S. Application Data

(62) Division of application No. 10/320,493, filed on Dec. 17, 2002, now Pat. No. 6,867,990.

(51) Int. Cl.
*G11C 15/00*    (2006.01)

(52) U.S. Cl. .................. 365/49; 365/203; 365/204; 365/205

(58) Field of Classification Search ............. 365/49, 365/203, 204, 205
See application file for complete search history.

(56) References Cited

U.S. PATENT DOCUMENTS

| 6,349,049 | B1 | 2/2002 | Schoy |
| 6,370,052 | B1* | 4/2002 | Hsu et al. .................. 365/49 |
| 6,442,054 | B1* | 8/2002 | Evans et al. ................ 365/49 |
| 6,515,884 | B1* | 2/2003 | Sywyk et al. ............... 365/49 |
| 6,760,241 | B1* | 7/2004 | Gharia ........................ 365/49 |
| 2002/0015348 | A1* | 2/2002 | Gillingham et al. ...... 365/227 |
| 2003/0123269 | A1 | 7/2003 | Gillingham et al. |

\* cited by examiner

*Primary Examiner*—Richard Elms
*Assistant Examiner*—N. Nguyen
(74) *Attorney, Agent, or Firm*—Dickstein Shapiro Morin & Oshinsky LLP (57) ABSTRACT

A CAM match detection circuit that maintains established levels of accuracy while greatly reducing the amount of power dissipated is disclosed. Rather than allowing the Matchline 185 voltage to swing between a precharge voltage level of VDD and ground, the Matchline voltage is restricted to swinging between a reduced precharge voltage level (i.e., a voltage level lower than VDD) and ground. Further, a source of a p-type transistor that makes up one transistor in each pair of series connected transistors is coupled to the Matchline thereby further reducing the Matchline swing voltage and the overall power dissipation of the match detection circuit.

25 Claims, 8 Drawing Sheets

REDUCING POWER DISSIPATION IN A MATCH DETECTION CIRCUIT

This application is a divisional of application Ser. No. 10/320,493, filed Dec. 17, 2002 now U.S. Pat. No. 6,867,990, the entire disclosure of which is incorporated herein.

FIELD OF THE INVENTION

The present invention relates generally to semiconductor memory, and more particularly to a match detection circuit for a content addressable memory.

BACKGROUND OF THE INVENTION

A content addressable memory (CAM) is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data being stored within a given memory location) against the entire list of pre-stored entries. As a result of their unique searching algorithm, CAM devices are frequently employed in network equipment, particularly routers and switches, computer systems and other devices that require rapid content searching.

In order to perform a memory search in the above-identified manner, CAMs are organized differently than other memory devices (e.g., random access memory (RAM), dynamic RAM (DRAM), etc.). For example, data is stored in a RAM in a particular location, called an address. During a memory access, the user supplies an address and reads into or gets back the data at the specified address.

In a CAM, however, data is stored in locations in a somewhat random fashion. The locations can be selected by an address bus, or the data can be written into the first empty memory location. Every location has a status bit that keeps track of whether the location is storing valid information in it or is empty and available for writing.

Once information is stored in a memory location, it is found by comparing every bit in memory with data placed in a match detection circuit. When the content stored in the CAM memory location does not match the data placed in the match detection circuit, the CAM device returns a no match indication. When the content stored in the CAM memory location matches the data placed in the match detection circuit, the CAM device returns a match indication. In addition, the CAM may return the identification of the address location in which the desired data is stored. Thus, with a CAM, the user supplies the data and gets back the address if there is a match found in memory.

Locally, CAMs perform an exclusive-NOR (XNOR) function, so that a match is indicated only if both the stored bit and the corresponding input bit are the same state. CAMs are designed so that any number of stored bits may be simultaneously detected for a match with the input bits in the match detection circuit. One way in which this is achieved is by coupling a plurality of storage devices and logic circuits to a common Matchline, as depicted in FIG. 1.

Figure 1:
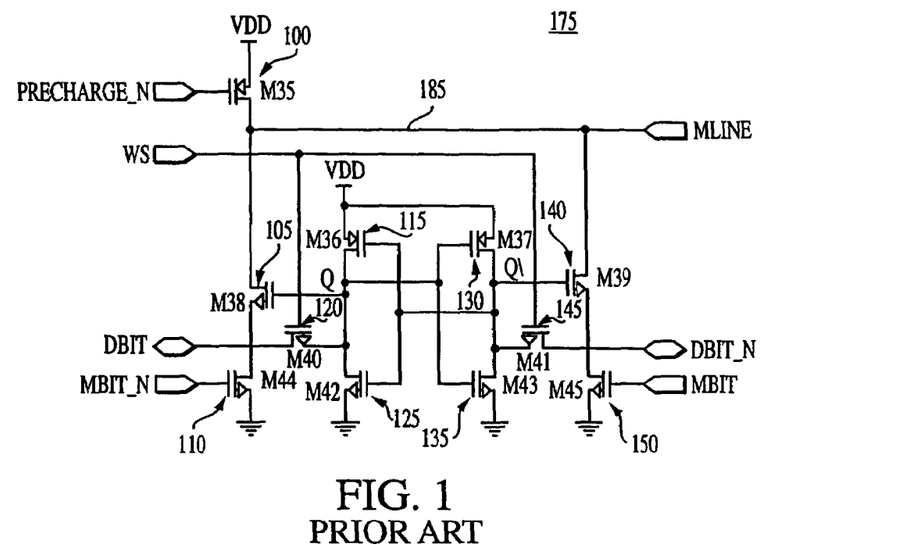
FIG. 1 is a schematic diagram of a conventional match detection circuit.

Turning to FIG. 1, a schematic diagram of a conventional match detection circuit 175 is depicted. A source terminal of a precharge transistor 100 is coupled to a positive voltage source (e.g., VDD). The gate of transistor 100 is configured to receive a Precharge_N signal. A drain terminal of transistor 100 is coupled to a Matchline 185 for precharging the Matchline 185 to a predetermined voltage level (e.g., VDD).

Transistors 115, 125, 130 and 135 make up a flip-flop memory storage cell for storing a true logic state Q of a stored bit and a complementary logic state Q' of the stored bit. Sources of transistors 115 and 130 are coupled to VDD and sources of transistors 125 and 135 are coupled to ground, thereby enabling the writing of a logic HIGH (e.g., "1") and a logic LOW (e.g., "0") in the flip-flop depending upon the command received on the bit line DBIT. As is known in the art, the flip-flop is accessed when both the word select line (WS) and the column select (DBIT) are simultaneously activated.

As for the comparison portion of match detection circuit 175, the gate of transistor 105 is coupled to Q and the gate of transistor 140 is coupled to Q'. Respective drain terminals of transistors 105 and 140 are coupled to the Matchline 185 and respective sources of transistors 105 and 140 are coupled to respective drains of transistors 110 and 150. Respective sources of transistors 110 and 150 are coupled to ground.

During a comparison operation, the Matchline 185 is precharged to VDD. Then the logic state of input bit MBIT is compared with the logic state of the stored bit Q. If the logic state of MBIT matches the logic state of Q, at least one transistor of the series connected transistor pairs (i.e., 105 and 110 or 140 and 150) is inactive, and therefore, the Matchline remains at VDD signifying a matched bit is detected. In practice, many stored bits are simultaneously compared with many input bits and if all input bits match their associated stored bits, then the Matchline 185 remains at a logic HIGH level.

In practice, however, it is more likely than not that at least one bit of a string of input bits will not match its corresponding bit location of the stored bit. In such a case, both transistors of at least one pair of series connected transistors (i.e., 105 and 110 or 140 and 150) will be active and the Matchline 185 will be discharged from VDD to ground, thereby signifying that a mismatch was detected.

In the above-identified process, the searched data (i.e., the input bits) is simultaneously compared with every data word in the CAM in order to find a match between the stored data and the input data. Since the comparison operation is conducted simultaneously on the entire memory, and is typically repeated at a very high frequency, this operation consumes a significant amount of power.

Power dissipation, P, in complementary metal-oxide semiconductor (CMOS) circuits, such as that depicted in FIG. 1, is related to the magnitude of Matchline signal swing, V, the load capacitance C, and the frequency of operation F as $P=C*F*V^2$. Since the magnitude of Matchline signal swing, V, for typical match detection circuits is from VDD to ground, the power dissipated by the circuit is exceedingly high. Therefore, it is desirable to find a way to reduce power dissipation of CAM match detection circuits while maintaining the same levels of accuracy.

BRIEF SUMMARY OF THE INVENTION

The present invention provides a CAM match detection circuit that maintains established levels of accuracy while greatly reducing the amount of power dissipated. In accordance with an exemplary embodiment of the invention, rather than allowing the Matchline 185 voltage to swing between a precharge voltage level of VDD and ground, the Matchline voltage is restricted to swinging between a reduced precharge voltage level (i.e., a voltage level lower than VDD) and ground. In another exemplary embodiment of the invention, a source of a p-type transistor that makes up one transistor in each pair of series connected transistors is coupled to the Matchline thereby further reducing the Matchline swing voltage and the overall power dissipation of the match detection circuit.

BRIEF DESCRIPTION OF THE DRAWINGS

The above and other features and advantages of the invention will be more readily understood from the following detailed description of the invention which is provided in connection with the accompanying drawings.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those of ordinary skill in the art to make and use the invention, and it is to be understood that structural, logical or procedural changes may be made to the specific embodiments disclosed without departing from the spirit and scope of the present invention.

Figure 2:
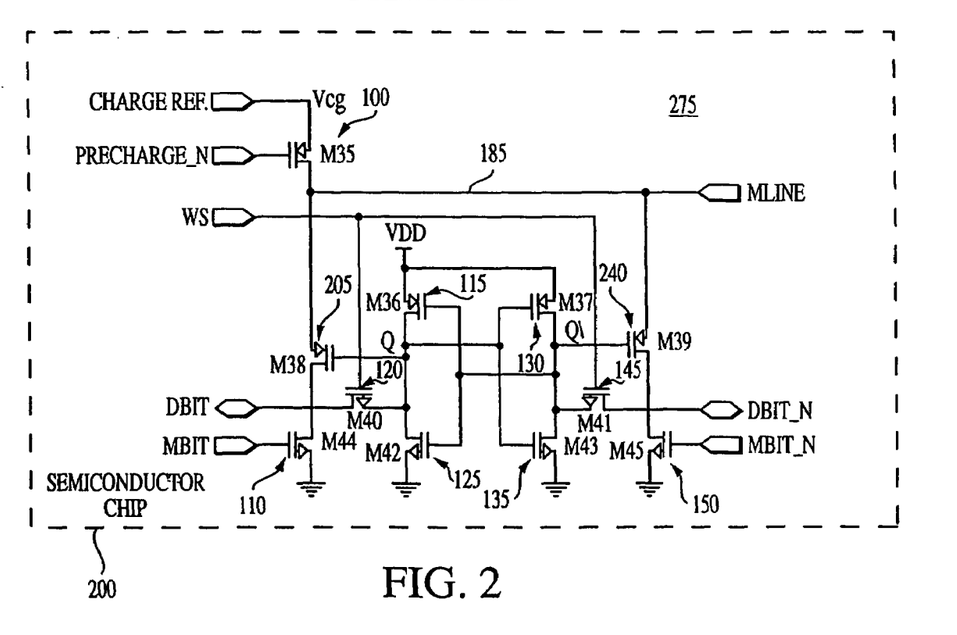
FIG. 2 is a schematic diagram of a match detection circuit in accordance with a first exemplary embodiment of the invention.

FIG. 2 depicts a schematic diagram of a CAM match detection circuit 275, in accordance with an exemplary embodiment of the invention. Match detection circuit 275 depicts only one memory cell and only one input bit coupled to the Matchline 185, however, this is only to simplify the description of the invention. A typical match detection circuit 275 would have a plurality of stored bits being compared with a plurality of input bits.

The configuration of the FIG. 2 match detection circuit 275 differs from that of the FIG. 1 match detection circuit 175 in three significant ways. First, n-type transistors 105 and 140 have been replaced with p-type transistors 205 and 240 with the respective sources of transistors 205 and 240 coupled to the Matchline 185. Second, the precharge voltage has been reduced from VDD to Vcg, a voltage level lower than VDD, and third, transistor 110 now connects to MBIT instead of MBIT_N, and transistor 150 now connects to MBIT_N instead of MBIT. Further, match detection circuit 275 is depicted on a semiconductor chip 200.

During operation of match detection circuit 275, the Matchline 185 is precharged to Vcg. If a match is detected between the input bit (e.g., MBIT) and its corresponding stored bits (e.g., Q), then the Matchline 185 remains at a logic HIGH level (i.e., Vcg). If a mismatch is detected between the input bit and the stored bit, then the Matchline 185 is discharged from Vcg to ground.

Significantly, when the Matchline 185 voltage is discharging from Vcg to ground, eventually, the Matchline voltage will discharge to a level just below the threshold voltage (e.g., approximately 0.75V, depending on the technology used) of the p-type transistor through which the Matchline 185 is being discharged (e.g., 205, 240). The p-type transistor (e.g., 205, 240) then cuts off and no longer conducts. That is, the threshold voltage (e.g., 0.75V) becomes the voltage level associated with a logic LOW state when a mismatch is detected. In accordance with this embodiment of the invention, the voltage swing is limited to Vcg-Vthreshold (Vth), thereby significantly reducing the power dissipated by the match detection circuit 275.

While the FIG. 2 match detection circuit depicts both i) the use of reduced precharge voltage, Vcg, and ii) the use of p-type transistors having their respective sources coupled to the Matchline 185, it should be readily understood that while the use of both renders superior results, the use of both is not necessary for practicing the invention. Advantageous results can be realized by using only one of these measures.

Figure 3:
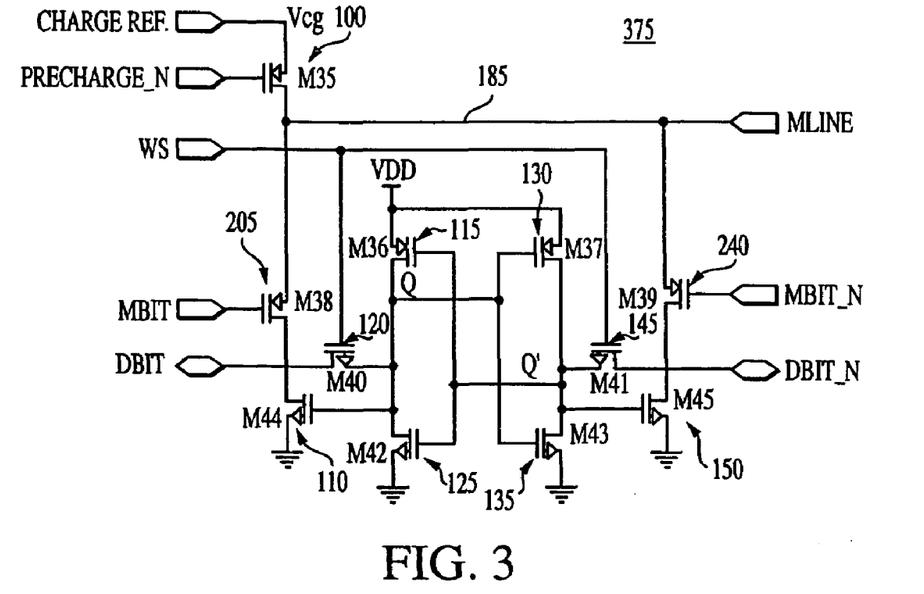
FIG. 3 is a schematic diagram of a match detection circuit in accordance with a second exemplary embodiment of the invention.

Turning to FIG. 3, a schematic diagram of a CAM match detection circuit 375 is depicted in accordance with another exemplary embodiment of the invention. The configuration of the FIG. 3 match detection circuit 375 differs from that of the FIG. 2 match detection circuit 275 in that the gates of p-type transistors 205 and 240 are respectively coupled to MBIT and MBIT_N, rather than to Q and Q'. In addition, the gates of transistors 110 and 150 are respectively coupled to Q and Q', rather than to MBIT and MBIT_N. Other than the above-described configuration differences, match detection circuit 375 is identical to match detection circuit 275, and the operation of match detection circuit 375 is identical to that described above for match detection circuit 275.

Further, with reference to FIG. 3, Vcg may advantageously be selected to be equal to the threshold voltage (Vth) of the p-type transistors 205,240 plus Vsmall, where Vsmall is estimated to be approximately Vth/3 (or some other small value). Where the stored bit Q is logic HIGH and the input bit MBIT is logic LOW (e.g., 0V), and the Matchline 185 is precharged to Vcg, as described above, current will flow through transistors 205 and 110 and the Matchline 185 will be discharged down to Vth. However, if the voltage representative of a logic LOW condition for MBIT is raised from 0V to a level just above Vsmall, the voltage between the gate and the source of transistor 205 is smaller than Vth, thus causing transistor 205 to turn off. Therefore, in accordance with another exemplary embodiment of the invention, very slight voltage adjustments on MLINE can enable the switching of current flowing from the Matchline 185.

Figure 4:
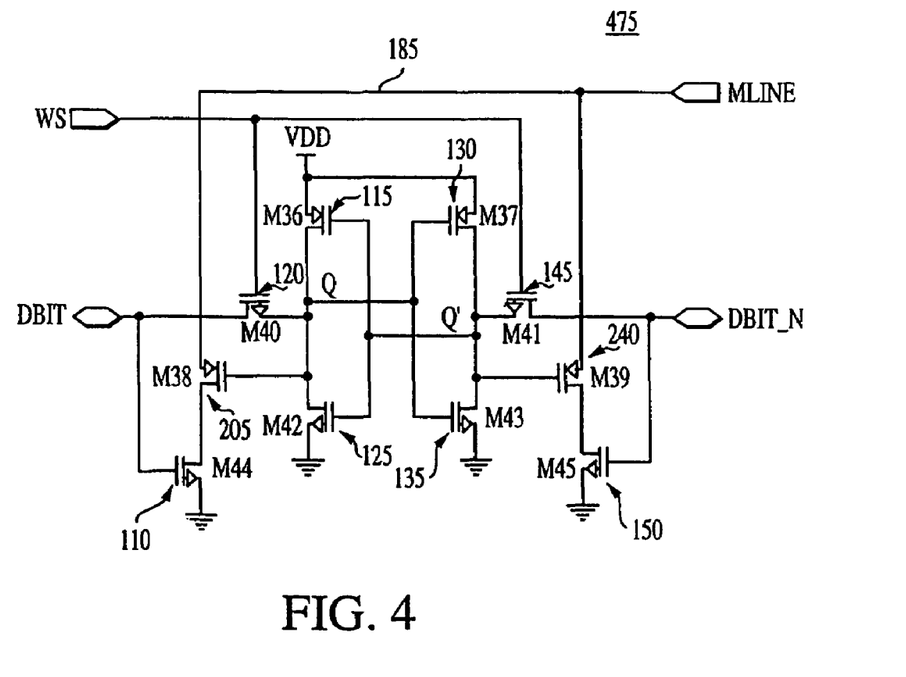
FIG. 4 is a schematic diagram of a match detection circuit in accordance with a third exemplary embodiment of the invention.

Turning to FIG. 4, a schematic diagram of a CAM match detection circuit 475 is depicted in accordance with yet another exemplary embodiment of the invention. The configuration of the FIG. 4 match detection circuit 475 differs from that of the FIG. 2 match detection circuit 275 in that the MBIT and DBIT lines are combined. In this configuration, both a match detection and a read/write operation cannot be performed simultaneously since the match detection operation and the read/write operations share signal lines. Other than this variation, the operation of the FIG. 4 match detection circuit 475 is identical to that of the FIG. 2 match detection circuit 275.

Figure 5:
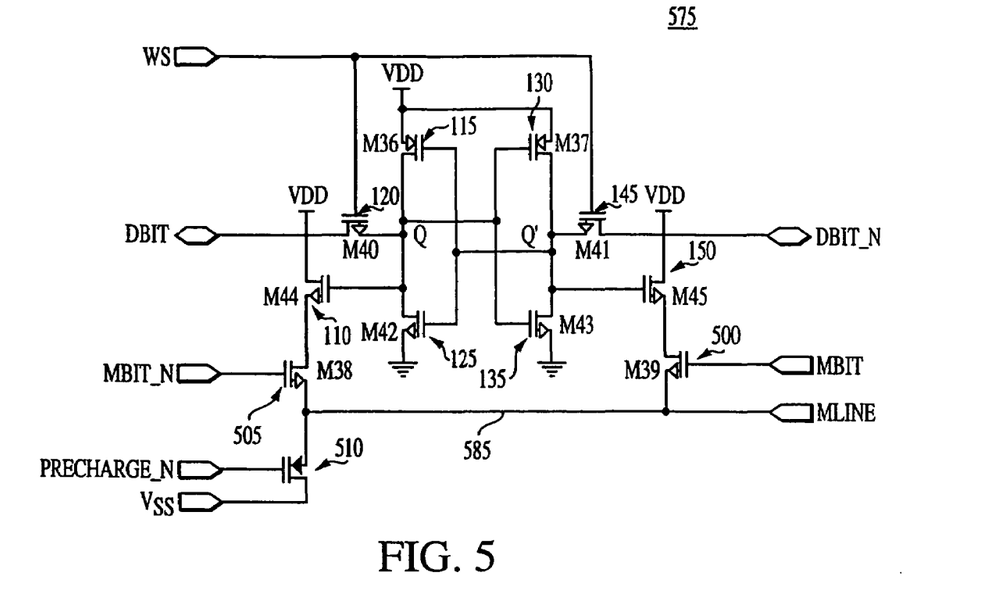
FIG. 5 is a schematic diagram of a match detection circuit in accordance with a fourth exemplary embodiment of the invention.

Turning to FIG. 5, a schematic diagram of a CAM match detection circuit 575 is depicted in accordance with another exemplary embodiment of the invention. In this configuration, the Matchline 585 is located at the lower portion of the circuit and is coupled to the ground terminal (e.g., VSS) via precharge transistor 510. Here, the Matchline 585 is precharged to VSS via p-type precharge transistor 510. It should be noted that if precharge transistor 510 is an n-type transistor, a Precharge signal, rather than the Precharge_N signal, would be used. When a match is detected between the input bit and the stored bit, the Matchline remains at logic LOW (e.g., VSS), thereby signifying that a match has been detected. When a mismatch is detected, the voltage on the Matchline is increased from VSS to VDD.

Significantly, transistors 505 and 500 are n-type transistors having their respective sources coupled to the Matchline 585. As a result, when a mismatch is detected, as is the case most of the time, the Matchline 585 voltage increases only as far as the threshold voltage (e.g., 0.75V) of the transistors 505, 500. Once the threshold voltage is reached, the transistors 505, 500 are cut off and stop conducting. The threshold voltage is then considered to be the logic HIGH state which signifies a mismatch on the Matchline 585. Consequently, the Matchline voltage swing is reduced to Vth−VSS since the Matchline 585 voltage never reaches VDD and the overall power dissipation of the match detection circuit 575 is greatly reduced.

Figure 6:
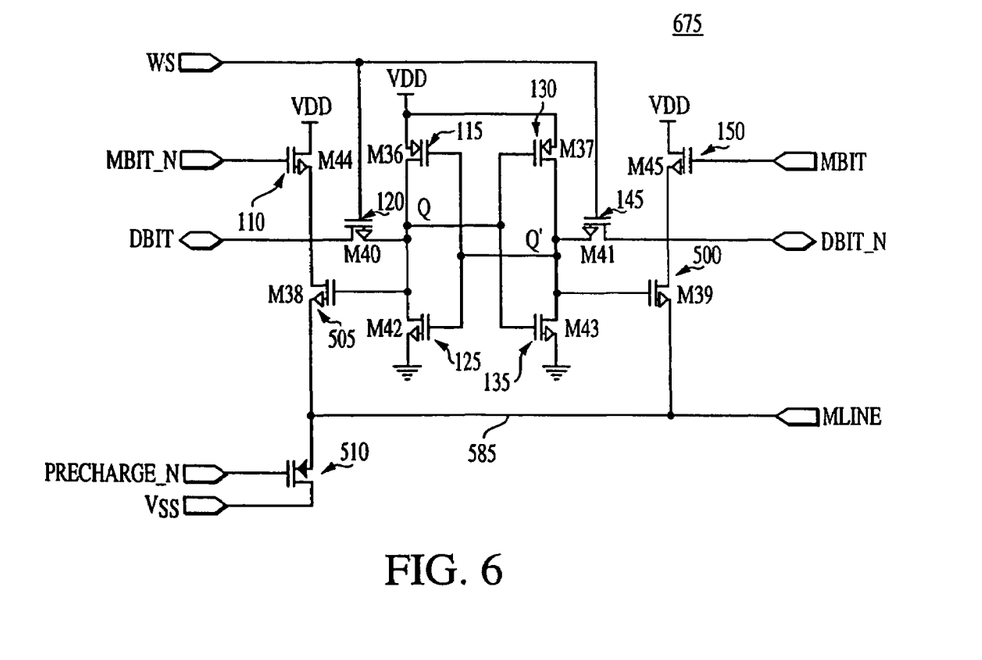
FIG. 6 is a schematic diagram of a match detection circuit in accordance with a fifth exemplary embodiment of the invention.

Turning to FIG. 6, a simplified schematic diagram of a match detection circuit 675 is depicted in accordance with another exemplary embodiment of the invention. The configuration of the FIG. 6 match detection circuit 675 differs from that of the FIG. 5 match detection circuit 575 in that the location of transistors 505 and 110 are switched and also in that the location of transistors 500 and 150 are switched. That is, the gate of transistor 505 is coupled to Q and the gate of transistor 110 is coupled to MBIT_N. Further, the gate of transistor 500 is coupled to Q' and the gate of transistor 150 is coupled to MBIT. The operation of match detection circuit 675 is identical to that of match detection circuit 575.

Figure 7:
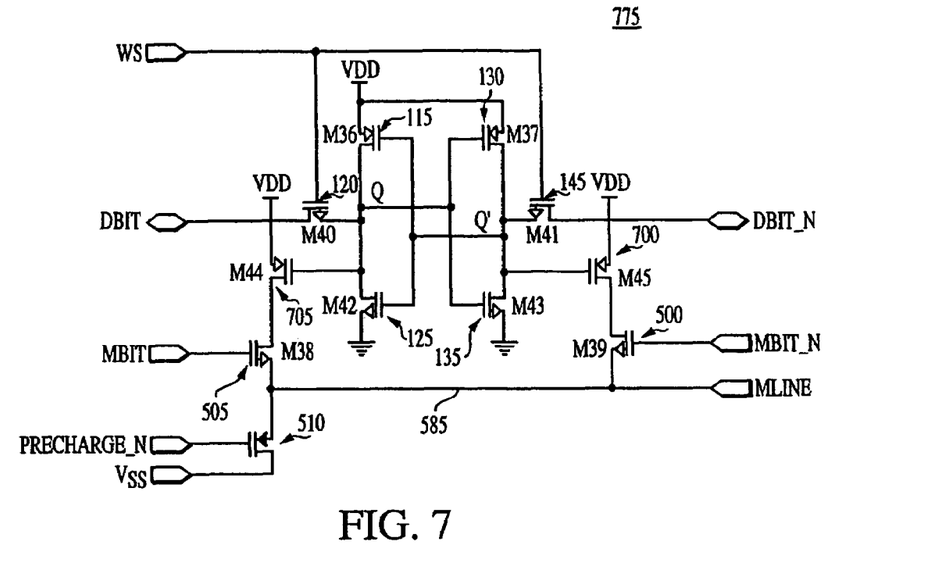
FIG. 7 is a schematic diagram of a match detection circuit in accordance with a sixth exemplary embodiment of the invention.

Turning to FIG. 7, a simplified schematic diagram of a match detection circuit 775 is depicted in accordance with another exemplary embodiment of the invention. The configuration of the FIG. 7 match detection circuit 775 is similar to that of the FIG. 5 match detection circuit 575 except that n-type transistors 110 and 150 are respectively replaced with p-type transistors 705 and 700. Further, the positions of MBIT and MBIT_N are switched in the FIG. 7 match detection circuit 775, as compared with the FIG. 5 match detection circuit 775. The operation of the FIG. 7 match detection circuit is the same as that of the FIG. 5 match detection circuit 775.

Figure 8:
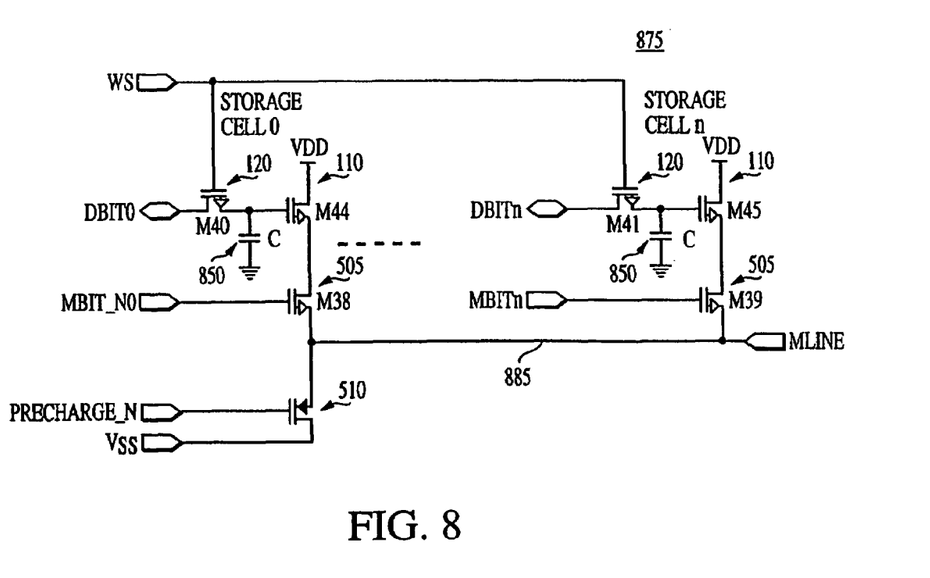
FIG. 8 is a schematic diagram of a match detection circuit in accordance with a seventh exemplary embodiment of the invention.

FIG. 8 depicts a simplified schematic diagram of a match detection circuit 875 implemented in a CAM based on a dynamic random access memory (DRAM) array. For simplicity, only one row of DRAM based CAM cells (0 through n) is depicted. Each memory cell contains a storage capacitor 850 and an access transistor 120. The access transistor 120 has its gate coupled to the wordline WS and its drain coupled a column line (e.g., DBIT0). Charge is stored on capacitor 850 and read from and written to the cell via access transistor 120.

In CAM match detection circuit 875, the stored bit is compared with the input bit on the MBIT_N line. The stored bit is coupled to the gate of transistor 110 and the incoming bit, MBIT_N, is coupled to the gate of transistor 505. First, the Matchline 885 is precharged to VSS. If a match is detected, the Matchline 885 is not coupled to VDD, via at least one pair of series connected transistors (e.g., 110 and 505) and the Matchline 885 remains at VSS, thus signifying that a match was detected. If a mismatch is detected, then the Matchline 885 will be coupled to VDD and the Matchline voltage will rise toward VDD.

It should be noted that similarly to the FIGS. 5–7 match detection circuits, as the Matchline 885 voltage rises above the threshold voltage of the n-type transistor (e.g., 505) coupled to the Matchline 885, the transistor (e.g., 505) cuts off and stops conducting. As a result, the Matchline 585 voltage swing is essentially equal to the threshold voltage. Accordingly, the power dissipated by this match detection circuit 875 is greatly reduced.

Figure 9:
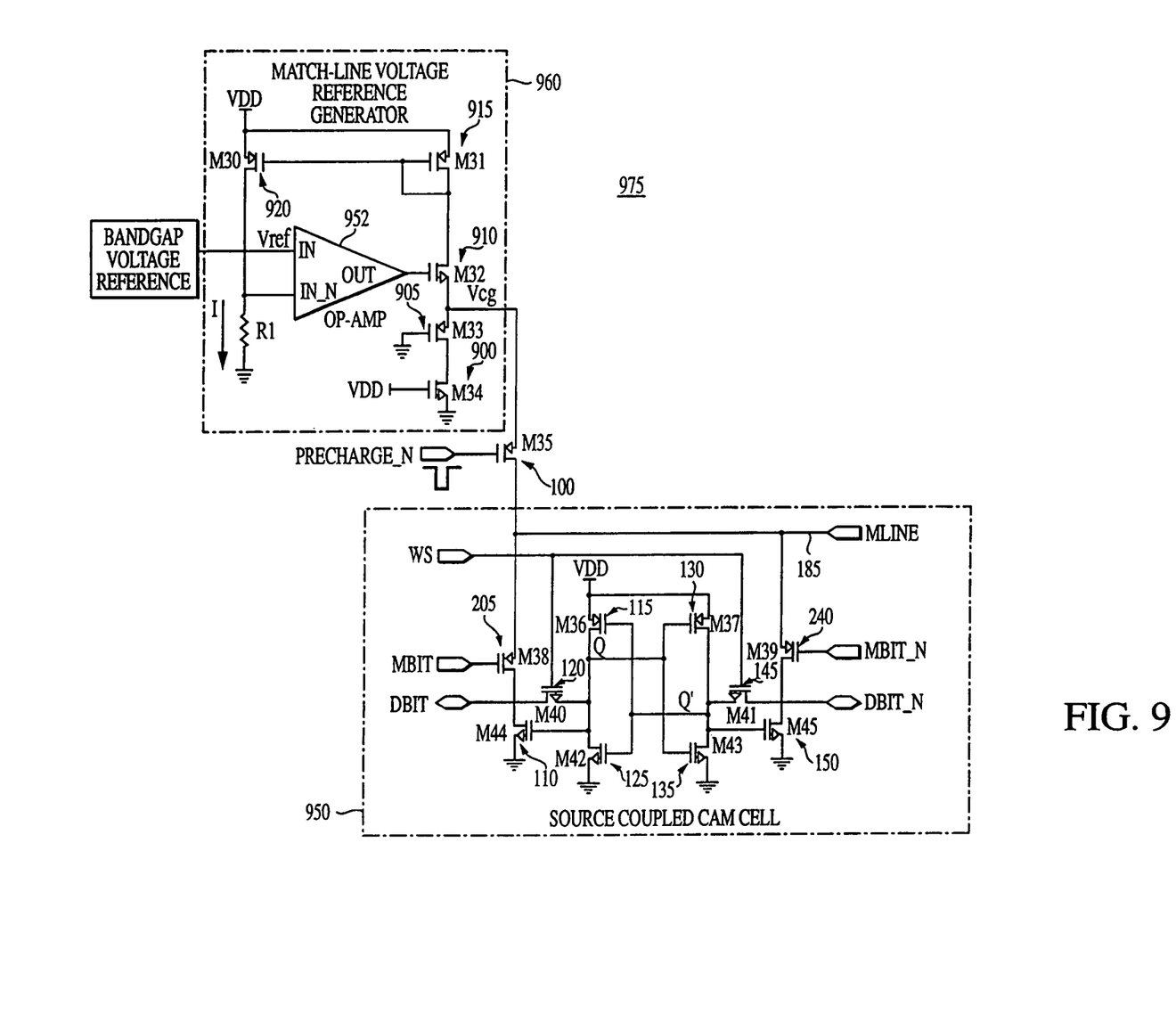
FIG. 9 is a schematic diagram of a match detection circuit in accordance with an eighth exemplary embodiment of the invention.

Turning to FIG. 9, a match detection circuit 975 is depicted in accordance with another exemplary embodiment of the invention. As described above in connection with FIGS. 2–4, rather than being precharged to VDD, the Matchline 185 is precharged to a voltage less than VDD (e.g., Vcg). Also, as described above, since the transistors coupled to the Matchline 185 have their respective sources coupled to the Matchline 185, the voltage swing is further reduced since the transistors are cut off once the Matchline 185 voltage decreases below the threshold voltage, thereby limiting the swing voltage (Vs) to Vcg−Vth.

While it is desirable to have Vs as small as possible, as the power dissipation is largely a function of Vs, it is the precharge voltage level of the Matchline 185 that determines the level of current that flows through the p-type match detection circuit transistors (e.g., 205 and 240 of FIG. 2). With Vs maintained at a relatively low level, the transistors 205, 240 are not switched on in their saturation state, but rather, they are switched on in their linear region of operation. In the linear region, the current through the transistors 205, 240 is largely dependent upon the magnitude of Vs. That is, as Vs varies, so does the current flow through transistors 205, 240. It is desirable to regulate the current flow through transistors 205, 240 so as to maintain the current flow at a desired optimum level. The optimum level for the current is a level that minimizes power dissipation, while still enabling a determination of whether a match exists between the input bits and the stored bits. Further, since there are typically 200 match detection cells on a single Matchline 185, it is desirable to maintain the current flowing through the match detection circuits as consistent and as small as possible.

Turning to a discussion on the optimum current level, since for proper operation of the Matchline 185, it must be able to discharge from its precharge voltage in a short time, the current through the p-type transistors 205, 240 must be C*Vs/t, where C is the parasitic capacitance of the Matchline 185 and t is the desired discharge time.

With reference to the above, FIG. 9 depicts a match detection circuit 975 having a source coupled CAM cell 950 similar to that of FIG. 2 coupled to a Matchline Voltage Reference Generator (Generator) 960. The Generator 960 generates and regulates Vcg so that Vcg is maintained at an optimal level for reducing power dissipation while still enabling detection of a match condition versus a mismatch condition.

A reference voltage Vref is received at one input of the operational amplifier (op-amp) 952. A voltage equal to I1*R1 is received at the other input of op-amp 952. The output of op-amp 952 serves to activate transistor 910, which activates transistors 915 and 920. Vcg is maintained at a level substantially equal to I1*R1. The level of Vcg, and therefore the level of current passing though the p-type transistors 205, 240 can be set by the value of R1.

Figure 10:
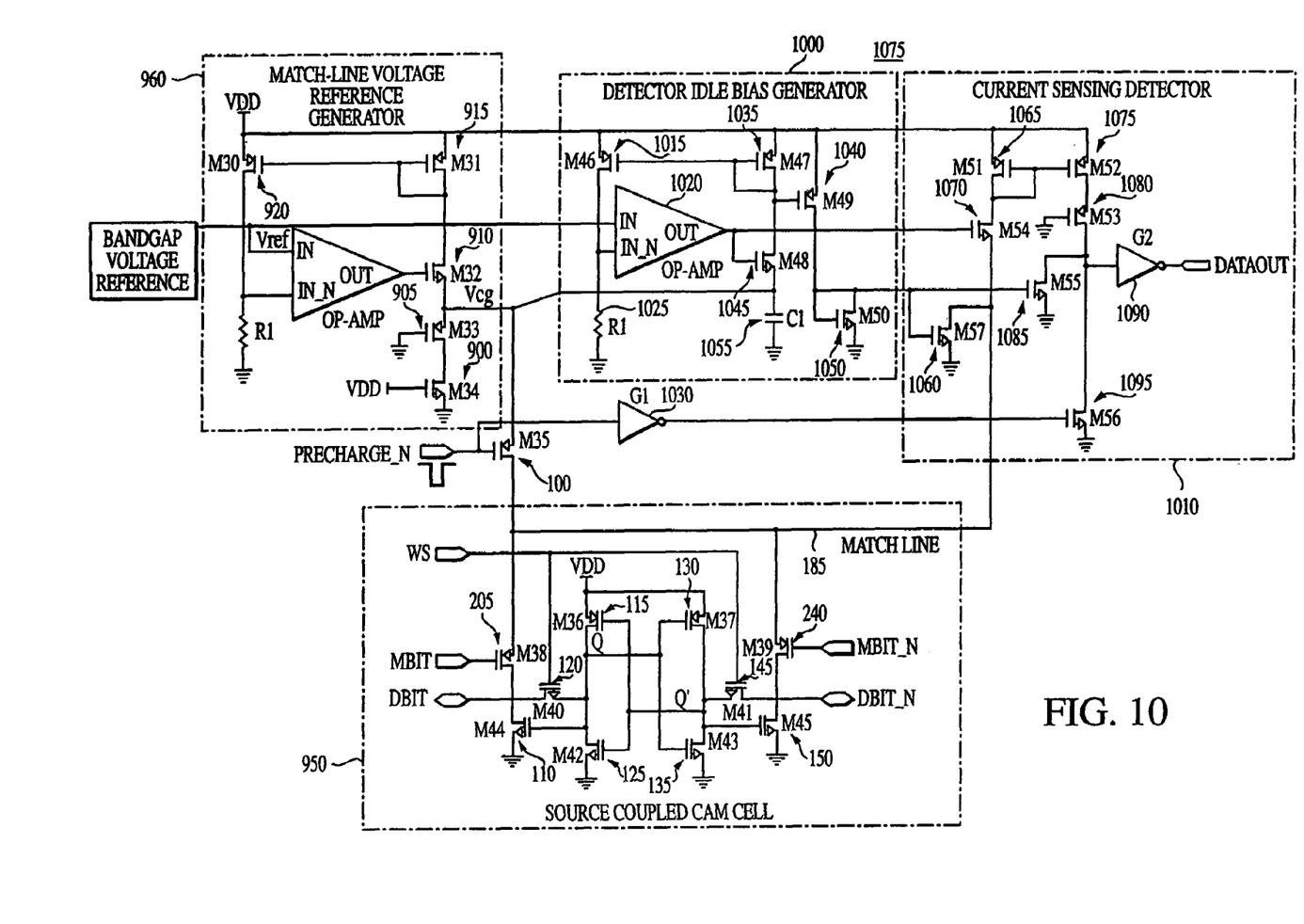
FIG. 10 is a schematic diagram of a match detection circuit in accordance with a ninth exemplary embodiment of the invention.

Turning to FIG. 10, a schematic diagram of a match detection system 1075 is depicted in accordance with another exemplary embodiment of the invention. The system includes the match detection circuit 975 of FIG. 9 and also includes a Detector Idle Bias Generator (Bias Generator) 1000 coupled to the output of Generator 960 (of FIG. 9). Further, an output of the Bias Generator 1000, the Matchline 185, and the logic level of the Precharge_N signal are received by Current Sensing Detector 1010.

The operation of bias generators, in general, are known in the art as generating a constant bias voltage for enabling an operation or circuit. Here, Bias Generator 1000 provides a bias voltage to the Current Sensing Detector 1010 so that the Current Sensing Detector 1010 is always enabled. The reference voltage Vref, as passed by operational amplifier 1020, is supplied to the gate of n-type transistor 1070, thus providing a constant enable signal to the Current Sensing Detector 1010. Providing such a constant bias to the Current Sensing Detector 1010 effectively reduces leakage current in transistor 1070 and the Current Sensing Detector 1010.

As for the Current Sensing Detector 1010, when a logic HIGH (e.g., match) is detected at the Matchline 185, a logic HIGH is detected at the DATAOUT terminal. Conversely, when a logic LOW (e.g., no match) is detected at the Matchline 185, a logic LOW is detected at the DATAOUT terminal. The logic level of DATAOUT is then forwarded to additional circuitry. The general operation of a current sensing detector, such as Current Sensing Detector 1010, is described in U.S. patent application Ser. No. 10/186,725, filed Jul. 2, 2002 by one of the present inventors.

Figure 11:
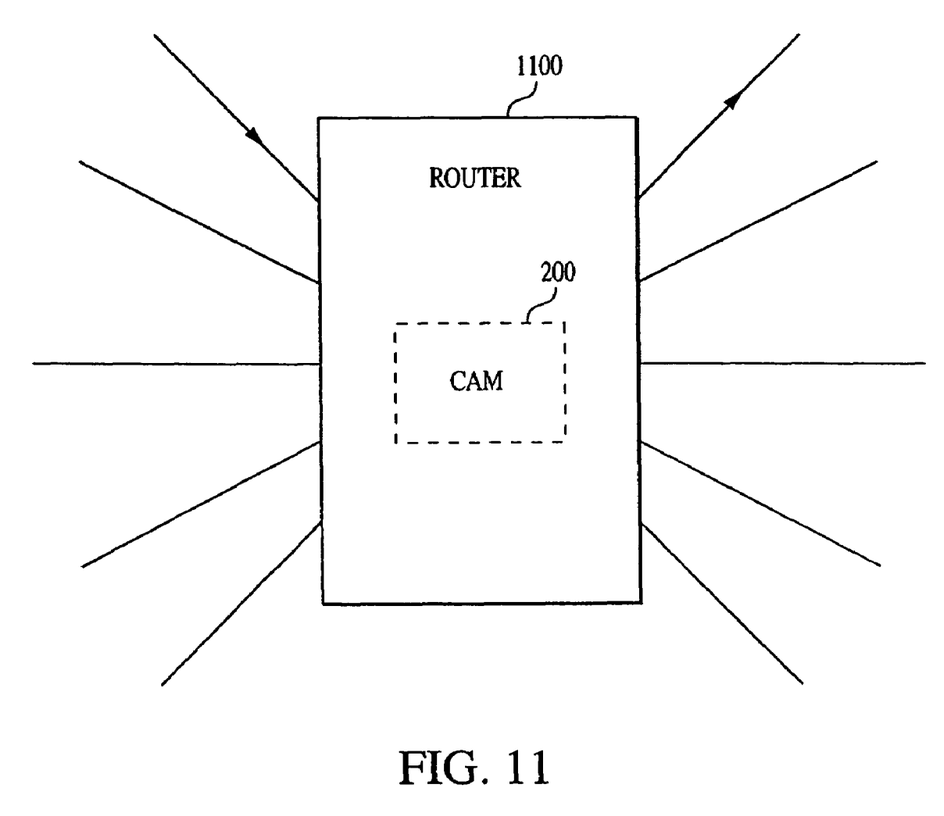
FIG. 11 depicts a simplified block diagram of a router employing the FIG. 2 memory chip in accordance with a tenth exemplary embodiment of the invention.

FIG. 11 is a simplified block diagram of a router 1100 as may be used in a communications network, such as, e.g., part of the Internet backbone. The router 1100 contains a plurality of input lines and a plurality of output lines. When data is transmitted from one location to another, it is sent in a form known as a packet. Oftentimes, prior to the packet reaching its final destination, that packet is first received by a router, or some other device. The router 1100 then decodes that part of the data identify the ultimate destination and decides which output line and what forwarding instructions are required for the packet.

Generally, CAMs are very useful in router applications because historical routing information for packets received from a particular source and going to a particular destination is stored in the CAM of the router. As a result, when a packet is received by the router 1100, the router already has the forwarding information stored within its CAM. Therefore, only that portion of the packet that identifies the sender and recipient need be decoded in order to perform a search of the CAM to identify which output line and instructions are required to pass the packet onto a next node of its journey.

Still referring to FIG. 11, router 1100 contains the added benefit of employing a semiconductor memory chip containing a CAM array, such as that depicted in FIG. 2. Therefore, not only does the router benefit from having a CAM but also benefits by having a CAM with reduced power dissipation, in accordance with an exemplary embodiment of the invention.

Figure 12:
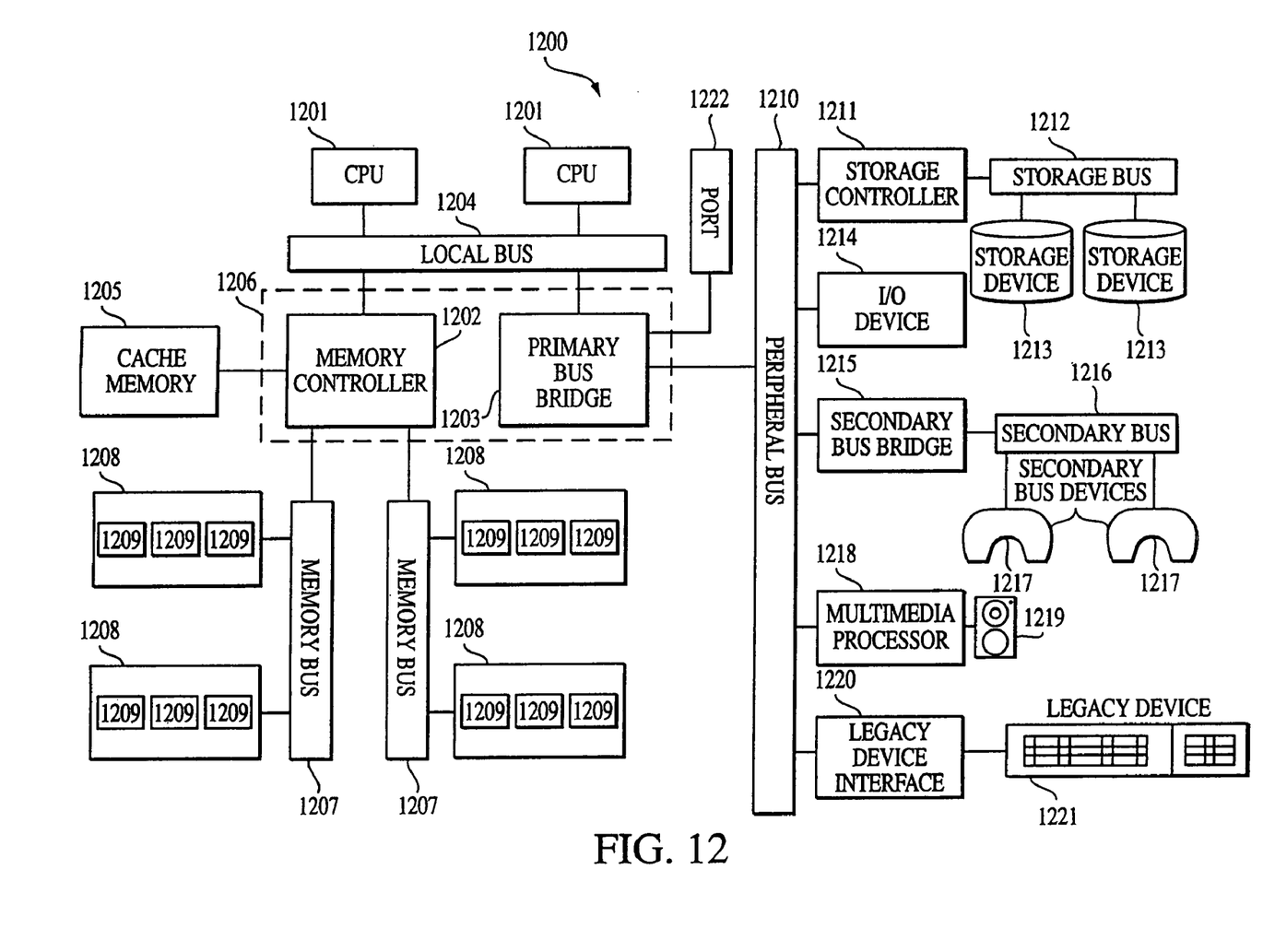
FIG. 12 depicts a block diagram of a processor system, in accordance with an eleventh exemplary embodiment of the invention.

FIG. 12 illustrates an exemplary processing system 1200 which utilizes a CAM match detection circuit such as, for example, the match detection circuit 275, which is located on semiconductor chip 200 of FIG. 2. The processing system 1200 includes one or more processors 1201 coupled to a local bus 1204. A memory controller 1202 and a primary bus bridge 1203 are also coupled the local bus 1204. The processing system 1200 may include multiple memory controllers 1202 and/or multiple primary bus bridges 1203. The memory controller 1202 and the primary bus bridge 1203 may be integrated as a single device 1206.

The memory controller 1202 is also coupled to one or more memory buses 1207. Each memory bus accepts memory components 1208. Any one of memory components 1208 may contain a CAM array containing a match detection circuit such as any of the match detection circuits described in connection with FIGS. 2–11.

The memory components 1208 may be a memory card or a memory module. The memory components 1208 may include one or more additional devices 1209. For example, in a SIMM or DIMM, the additional device 1209 might be a configuration memory, such as a serial presence detect (SPD) memory. The memory controller 1202 may also be coupled to a cache memory 1205. The cache memory 1205 may be the only cache memory in the processing system. Alternatively, other devices, for example, processors 1201 may also include cache memories, which may form a cache hierarchy with cache memory 1205. If the processing system 1200 include peripherals or controllers which are bus masters or which support direct memory access (DMA), the memory controller 1202 may implement a cache coherency protocol. If the memory controller 1202 is coupled to a plurality of memory buses 1207, each memory bus 1207 may be operated in parallel, or different address ranges may be mapped to different memory buses 1207.

The primary bus bridge 1203 is coupled to at least one peripheral bus 1210. Various devices, such as peripherals or additional bus bridges may be coupled to the peripheral bus 1210. These devices may include a storage controller 1211, an miscellaneous I/O device 1214, a secondary bus bridge 1215, a multimedia processor 1218, and an legacy device interface 1220. The primary bus bridge 1203 may also coupled to one or more special purpose high speed ports 1222. In a personal computer, for example, the special purpose port might be the Accelerated Graphics Port (AGP), used to couple a high performance video card to the processing system 1200.

The storage controller 1211 couples one or more storage devices 1213, via a storage bus 1212, to the peripheral bus 1210. For example, the storage controller 1211 may be a SCSI controller and storage devices 1213 may be SCSI discs. The I/O device 1214 may be any sort of peripheral. For example, the I/O device 1214 may be an local area network interface, such as an Ethernet card. The secondary bus bridge may be used to interface additional devices via another bus to the processing system. For example, the secondary bus bridge may be an universal serial port (USB) controller used to couple USB devices 1217 via to the processing system 1200. The multimedia processor 1218 may be a sound card, a video capture card, or any other type of media interface, which may also be coupled to one additional device such as speakers 1219. The legacy device interface 1220 is used to couple legacy devices, for example, older styled keyboards and mice, to the processing system 1200.

The processing system 1200 illustrated in FIG. 12 is only an exemplary processing system with which the invention may be used. While FIG. 12 illustrates a processing architecture especially suitable for a general purpose computer, such as a personal computer or a workstation, it should be recognized that well known modifications can be made to configure the processing system 1200 to become more suitable for use in a variety of applications. For example, many electronic devices which require processing may be implemented using a simpler architecture which relies on a CPU 1201 coupled to memory components 1208 and/or memory devices 1209. The modifications may include, for example, elimination of unnecessary components, addition of specialized devices or circuits, and/or integration of a plurality of devices.

It is desirable to have a CAM match detection circuit that dissipates less power while maintaining traditionally achieved levels of performance. The present invention accomplishes this by providing match detection circuits that reduce the magnitude of signal swing when a mismatch is detected. As illustrated by several exemplary embodiments of the invention, the Matchline voltage swings from the precharge voltage (e.g., Vcg) to VSS. In addition, p-type transistors are used with their sources coupled to the Matchline, thereby further limiting the voltage swing when the Matchline is discharged toward VSS. The reduced voltage swing during match detection greatly reduces the power dissipated by the match detection circuits.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention has been described in connection with specific circuits employing different configurations of p-type and n-type transistors, the invention may be practiced with many other configurations without departing from the spirit and scope of the invention. In addition, although the invention is described in connection with flip-flop memory cells and DRAM memory cells, it should be readily apparent that the invention may be practiced with any type of memory cell. Accordingly, the invention is not limited by the foregoing description or drawings, but is only limited by the scope of the appended claims.

What is claimed as new and desired to be protected by Letters Patent of the United States is:

1. A method for detecting a mismatch in a content addressable memory (CAM), the method comprising:
   charging a matchline of a match detection circuit of said CAM to a first voltage level lower than a supply voltage level;
   comparing a logic state of a first bit stored in said CAM with a logic state of a second bit received at said CAM, said comparison comprising receiving said logic state of said first bit at a gate of a first transistor, and receiving said logic state of said second bit at a gate of a second transistor in series with said first transistor, wherein if said logic state of said first bit does not match said logic state of said second bit, said first and second transistors are activated and conducting; and
   changing the voltage level of said matchline to a ground voltage level through said first and second transistors if the logic state of the first bit does not match the logic state of the second bit.

2. The method of claim 1, wherein said act of charging comprises:
   precharging said matchline to said first voltage level before said second bit is received at said CAM.

3. The method of claim 1, wherein said act of changing comprises coupling said matchline, via said first and second transistors, to a ground voltage terminal.

4. A method for detecting a mismatch in a content addressable memory (CAM), the method comprising:
   charging a matchline of a match detection circuit of said CAM to a supply voltage level;
   comparing a logic state of a first bit stored in said CAM with a logic state of a second bit received at said CAM, said act of comparing comprising receiving said logic state of said first bit at a gate of a first transistor coupled to said matchline; and receiving said logic state of said second bit at a gate of a second transistor in series with said first transistor, wherein if said logic state of said first bit does not match said logic state of said second bit, said first and second transistors are activated and conducting;
   discharging the voltage level of said matchline through said first and second transistors from said supply voltage level to a threshold voltage of said first transistor coupled to said matchline if the logic state of the first bit does not match the logic state of the second bit; and
   detecting said mismatch based on the change in voltage level of said matchline from said supply voltage level to said threshold voltage level.

5. The method of claim 4, wherein said act of charging comprises:
   precharging said matchline to said supply voltage level before said second bit is received at said CAM.

6. The method of claim 4, wherein said act of discharging comprises coupling said matchline, via said first and second transistors, to a ground voltage terminal and discharging said matchline toward said ground voltage level until said threshold voltage level is reached.

7. A method for detecting a mismatch in a content addressable memory (CAM), the method comprising:
   charging a matchline of a match detection circuit of said CAM to a first voltage level lower than a supply voltage level;
   comparing a logic state of a first bit stored in said CAM with a logic state of a second bit received at said CAM; and
   discharging the voltage level of said matchline from said first voltage level to a threshold voltage of a transistor coupled to said matchline if the logic state of the first bit does not match the logic state of the second bit;
   detecting said mismatch based on the change in voltage level of said matchline from said first voltage level to said threshold voltage level.

8. The method of claim 7 further comprising:
   detecting said stored bit is a logic HIGH state;
   detecting said received bit is a logic LOW state;
   increasing a voltage representative of said logic LOW state of said received bit so that said transistor coupled to said matchline is cut off at said threshold voltage.

9. The method of claim 7, wherein said act of charging comprises:
   precharging said matchline to said first voltage level before said second bit is received at said CAM.

10. The method of claim 7, wherein said act of comparing comprises:
receiving said logic state of said first bit at a gate of a first transistor; and
receiving said logic state of said second bit at a gate of a second transistor in series with said first transistor, wherein if said logic state of said first bit does not match said logic state of said second bit, said first and second transistors are activated and conducting.

11. The method of claim 10, wherein said act of discharging comprises coupling said matchline, via said first and second transistors, to a ground voltage terminal and discharging said matchline toward said ground voltage level until said threshold voltage level is reached.

12. A method for detecting a mismatch in a content addressable memory (CAM), the method comprising:
charging a matchline of a match detection circuit of said CAM to a ground voltage level;
comparing a logic state of a first bit stored in said CAM with a logic state of a second bit received at said CAM; and
changing the voltage level of said matchline to a voltage level greater than said ground voltage level if the logic state of the first bit does not match the logic state of the second bit; and
detecting said mismatch based on the change in voltage level of said matchline from said ground voltage level to said voltage level greater than said ground voltage level.

13. The method of claim 12, wherein said act of changing comprises changing said voltage level of said matchline to a threshold voltage level of a transistor of said match detection circuit coupled to said matchline.

14. The method of claim 12, wherein said act of charging comprises:
precharging said matchline to said ground voltage level before said second bit is received at said CAM.

15. The method of claim 12, wherein said act of comparing comprises:
receiving said logic state of said first bit at a gate of a first transistor; and
receiving said logic state of said second bit at a gate of a second transistor in series with said first transistor, wherein if said logic state of said first bit does not match said logic state of said second bit, said first and second transistors are activated and conducting.

16. The method of claim 15, wherein said act of changing comprises coupling said matchline, via said first and second transistors, to a supply voltage terminal and charging said matchline toward said supply voltage level until said threshold voltage level is reached.

17. The method of claim 15, wherein said act of changing comprises coupling said matchline, via said first and second transistors, to a voltage terminal at a voltage level lower than a supply voltage, and charging said matchline toward said voltage level lower than said supply voltage until said threshold voltage level is reached.

18. A match detection circuit for a content addressable memory (CAM), comprising:
a circuit for precharging a matchline to a first voltage level lower than a supply voltage level; and
a circuit for switchably coupling said matchline to a second ground voltage terminal through first and second transistors in series, for changing a logic state of said matchline when a logic state of a first stored bit of said CAM does not match a logic state of a second received bit of said CAM.

19. A match detection circuit for a content addressable memory (CAM), comprising:
a matchline configured to be precharged by a first voltage terminal to a first voltage level lower than a supply voltage level; and
a transistor having a threshold voltage level coupled to said matchline, said threshold voltage level representing a logic state of said matchline different from a logic state represented by said first voltage level; said transistor being configured to conduct if a logic state of a first stored bit of said CAM does not match a logic state of a second received bit of said CAM.

20. The match detection circuit of claim 19, wherein said transistor is a p-type transistor.

21. A match detection circuit for a content addressable memory (CAM), comprising:
a matchline configured to be precharged to a ground voltage level; and
a transistor having a threshold voltage level coupled to said matchline, said threshold voltage level representing a logic state of said matchline different from a logic state represented by said ground voltage level; said transistor being configured to conduct if a logic state of a first stored bit of said CAM does not match a logic state of a second received bit of said CAM.

22. The match detection circuit of claim 21, wherein said transistor is an n-type transistor.

23. A semiconductor memory chip, comprising:
a plurality of match detection circuits for a content addressable memory (CAM), each of said match detection circuits comprising:
a matchline configured to be precharged by a first voltage terminal to a first voltage level lower than a supply voltage level; and
a circuit for switchably coupling said matchline to a second ground voltage terminal through first and second transistors in series, for changing a logic state of said matchline if a logic state of a first stored bit of said CAM does not match a logic state of a second received bit of said CAM.

24. A semiconductor memory chip, comprising:
a plurality of match detection circuits for a content addressable memory (CAM), each of said match detection circuits comprising:
a matchline configured to be precharged by a first voltage terminal to a first voltage level lower than a supply voltage level; and
a transistor having a threshold voltage level coupled to said matchline said threshold voltage level representing a logic state of said matchline different from a logic state represented by said first voltage level; said transistor being configured to conduct if a logic state of a first stored bit of said CAM does not match a logic state of a second received bit of said CAM.

25. A semiconductor memory chip, comprising:
a plurality of match detection circuits for a content addressable memory (CAM), each of said match detection circuits comprising:
a matchline configured to be precharged to a ground voltage level; and wherein
a transistor having a threshold voltage level coupled to said matchline, said threshold voltage level representing a logic state of said matchline different from a logic state represented by said ground voltage level; said transistor being configured to conduct if a logic state of a first stored bit of said CAM does not match a logic state of a second received bit of said CAM.

* * * * *

UNITED STATES PATENT AND TRADEMARK OFFICE
CERTIFICATE OF CORRECTION

PATENT NO. : 7,020,000 B2 Page 1 of 1
APPLICATION NO. : 11/048843
DATED : March 28, 2006
INVENTOR(S) : Zvi Regev et al.

It is certified that error appears in the above-identified patent and that said Letters Patent is hereby corrected as shown below:

In the Specification, the following errors are corrected:

<u>Column 8:</u>

Line 34, "include" should read --includes--;

Line 45, "an miscellaneous" should read --a miscellaneous--;

Line 46, "an legacy" should read --a legacy--;

Lines 47-48, "also coupled" should read --also be coupled--;

Line 58, "an local" should read --a local--;

Line 62, "an universal" should read --a universal--; and

Line 63, "via to the" should read --via the--.

Signed and Sealed this

Eighteenth Day of July, 2006

JON W. DUDAS
*Director of the United States Patent and Trademark Office*